(12) United States Patent
Machida et al.

(10) Patent No.: US 9,437,700 B2
(45) Date of Patent: Sep. 6, 2016

(54) SEMICONDUCTOR DEVICE

(71) Applicants:KABUSHIKI KAISHA TOYOTA CHUO KENKYUSHO, Nagakute-shi, Aichi-ken (JP); TOYOTA JIDOSHA KABUSHIKI KAISHA, Toyota-shi, Aichi-ken (JP)

(72) Inventors: Satoru Machida, Nagakute (JP); Yusuke Yamashita, Nagakute (JP); Koichi Nishikawa, Nagakute (JP); Masaru Senoo, Okazaki (JP); Jun Okawara, Nisshin (JP); Yoshifumi Yasuda, Nisshin (JP); Hiroshi Hosokawa, Toyota (JP); Yasuhiro Hirabayashi, Toyota (JP)

(73) Assignees: KABUSHIKI KAISHA TOYOTA CHUO KENKYUSHO, Nagakute (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/640,566

(22) Filed: Mar. 6, 2015

(65) Prior Publication Data

US 2015/0279953 A1    Oct. 1, 2015

(30) Foreign Application Priority Data

Mar. 26, 2014    (JP) .................................. 2014-063289

(51) Int. Cl.
*H01L 29/45*    (2006.01)
*H01L 29/78*    (2006.01)
(Continued)

(52) U.S. Cl.
CPC ............. *H01L 29/456* (2013.01); *H01L 24/05* (2013.01); *H01L 29/16* (2013.01); *H01L 29/4236* (2013.01); *H01L 29/7397* (2013.01); *H01L 29/7813* (2013.01)

(58) Field of Classification Search
CPC ....................................................... H01L 29/45
See application file for complete search history.

(56) References Cited

U.S. PATENT DOCUMENTS 4,942,451 A * 7/1990 Tamaki ............... H01L 21/0274
257/437
4,988,423 A * 1/1991 Yamamoto ........ H01L 21/76877
204/192.17

(Continued)

FOREIGN PATENT DOCUMENTS

JP    S59-210667 A    11/1984
JP    S60-117771 A    6/1985

(Continued)

OTHER PUBLICATIONS

Jun. 14, 2016 Office Action issued in Japanese Patent Application No. 2014-063289.

*Primary Examiner* — Fernando L Toledo
*Assistant Examiner* — Valerie N Newton
(74) *Attorney, Agent, or Firm* — Oliff PLC

(57) ABSTRACT

A semiconductor device is provided with a silicon layer, an upper surface side aluminum layer containing silicon and an insulation film. The upper surface side aluminum layer contacts and is layered on a part of a surface of the silicon layer. The insulation film contacts and is layered on another part of the surface of the silicon layer. The insulation film is adjacent to and contacts the upper surface side aluminum layer. The insulation film includes an insulation film body and a plurality of first nodule segregated portions projecting from the insulation film body toward the upper surface side aluminum layer as seen along a vertical direction relative to the surface of the silicon layer. A corner is formed by a side surface of the insulation film body and a side surface of each of the first nodule segregated portions as seen along the vertical direction.

6 Claims, 5 Drawing Sheets

(51) Int. Cl.
  *H01L 29/739* (2006.01)
  *H01L 29/423* (2006.01)
  *H01L 29/16* (2006.01)
  *H01L 23/00* (2006.01)

(56) References Cited

U.S. PATENT DOCUMENTS

| | | |
|---|---|---|
| 5,308,786 A | 5/1994 | Lur et al. |
| 5,492,848 A | 2/1996 | Lur et al. |
| 2001/0034128 A1 | 10/2001 | Usami et al. |
| 2002/0043684 A1 | 4/2002 | Kubo |
| 2002/0187597 A1 | 12/2002 | Ninomiya |
| 2006/0163653 A1 | 7/2006 | Nishiwaki |
| 2007/0032075 A1 | 2/2007 | Usami et al. |
| 2009/0174076 A1 | 7/2009 | Sasaki et al. |

FOREIGN PATENT DOCUMENTS

| | | |
|---|---|---|
| JP | S61-226958 A | 10/1986 |
| JP | S62-204572 A | 9/1987 |
| JP | S63-133649 A | 6/1988 |
| JP | H04-230024 A | 8/1992 |
| JP | H06-163719 A | 6/1994 |
| JP | H08-124877 A | 5/1996 |
| JP | H08-236617 A | 9/1996 |
| JP | 2000-228403 A | 8/2000 |
| JP | 2001-308094 A | 11/2001 |
| JP | 2002-050760 A | 2/2002 |
| JP | 2002-368221 A | 12/2002 |
| JP | 2005-032939 A | 2/2005 |
| JP | 2005-347313 A | 12/2005 |
| JP | 2008-159967 A | 7/2008 |
| JP | 2010-278164 A | 12/2010 |

\* cited by examiner

SEMICONDUCTOR DEVICE

CROSS-REFERENCE TO RELATED APPLICATION

This application claims priority to Japanese Patent Application No. 2014-063289 filed on Mar. 26, 2014, the contents of which are hereby incorporated by reference into the present application.

TECHNICAL FIELD

The present application relates to a semiconductor device provided with an aluminum layer layered on a surface of silicon layer.

DESCRIPTION OF RELATED ART

Aluminum has been used as an electrode material in many recent semiconductor devices. In these semiconductor devices, an aluminum layer is layered on a surface of a silicon layer. In this structure, during heat treatment to bond the layered silicon layer and aluminum layer, aluminum as protrusions may go inside the silicon layer from the surface of the silicon layer. Such a phenomenon is generally called 'alloy spikes.' The alloy spikes may be suppressed by adding silicon of a small amount in advance to the aluminum layer. However, the adding of silicon to the aluminum layer may cause segregation of the silicon in the aluminum layer as nodules on the surface of the silicon layer under the aluminum layer, while it contributes to the suppression of the alloy spikes. In such a presence of this segregation of the nodules, the nodules may hinder current conduction of a semiconductor device, thereby increasing an electrical resistance.

Japanese Patent Application Publication No. H06-163719 (1994) discloses a technique of suppressing the segregation of nodules. The technique of the literature includes: a step of forming a contact hole in an insulation film covering a surface of a silicon layer; a step of covering the surface of the silicon layer exposed in the contact hole with a pure aluminum layer not containing silicon; a step of forming an aluminum-silicon layer containing silicon on the pure aluminum layer; and a step of forming electrode wiring by etching the aluminum layer and the aluminum-silicon layer simultaneously. However, according to the technique of the literature, there was a problem that some nodules are segregated in scattered positions, so that a nodule might be segregated in an unexpected position.

BRIEF SUMMARY OF INVENTION

It is therefore an object of the present specification to provide a semiconductor device capable of controlling a position where a silicon nodule is to be segregated.

The present specification discloses a semiconductor device comprising: a semiconductor layer; an aluminum layer containing silicon, the aluminum layer contacting and layered on a part of a surface of the semiconductor layer; and an insulation film contacting and layered on another part of the surface of the semiconductor layer, the insulation film being adjacent to and contacting the aluminum layer. The insulation film includes an insulation film body and a plurality of first nodule segregated portions projecting from the insulation film body toward the aluminum layer as seen along a vertical direction relative to the surface of the semiconductor layer. A corner is formed by a side surface of the insulation film body and a side surface of each of the first nodule segregated portions as seen along the vertical direction.

In this structure, silicon contained in the aluminum layer is segregated as nodules (small masses of silicon) when the aluminum layer is heated. At this time, as a result of the presence of the corners formed by the side surface of the insulation film body and the side surfaces of the first nodule segregated portions in the aforementioned semiconductor device, a core of each silicon nodule is likely to be formed at such a corner, and the nodule is segregated intensively with the core working as a center of the nodule. In this way, the silicon nodules can be concentrated in the corners such that the silicon nodules can be located locally by forming the corners in the insulation film. Thus, position controls as to where the nodules are to be segregated can be performed.

DETAILED DESCRIPTION OF INVENTION

Figure 1:
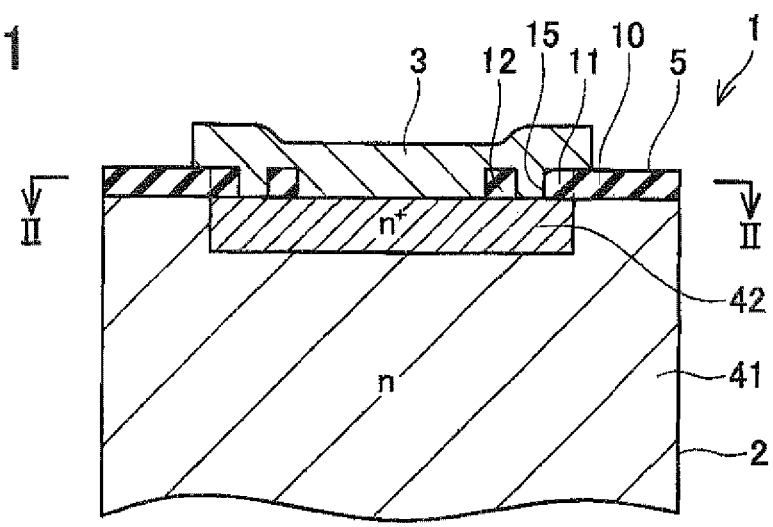
FIG. 1 is a sectional view of a semiconductor device according to an embodiment.

Embodiments are described below by referring to the accompanying drawings. As shown in FIG. 1, a semiconductor device 1 of the present embodiment includes a silicon layer 2 (an example of a "semiconductor layer") and a front-surface side aluminum layer 3 layered on a front surface of the silicon layer 2. The semiconductor device 1 further includes an insulation film 5 layered on the front surface of the silicon layer 2.

The silicon layer 2 contains silicon as a major component and includes an n-type drift region 41 and an n-type contact region 42. An n-type impurity concentration in the contact region 42 is higher than a n-type impurity concentration in the drift region 41. A front surface side of the silicon layer 2 (upper side of FIG. 1) is an anode side. A rear surface side of the silicon layer 2 (lower side of FIG. 1) is a cathode side.

A central part of the front-surface side aluminum layer 3 is disposed on the silicon layer 2 to serve as an electrode for the silicon layer 2. The front-surface side aluminum layer 3 contacts the contact region 42 of the silicon layer 2. The front-surface side aluminum layer 3 contacts a part of the silicon layer 2. End parts of the front-surface side aluminum layer 3 are disposed on the insulation film 5 and contacts a surface of the insulation film 5. The front-surface side aluminum layer 3 is formed by sputtering, for example. The front-surface side aluminum layer 3 contains aluminum as a major component and silicon as an accessory component. A content rate of silicon in the front-surface side aluminum layer 3 is less than 10 weight percent. The silicon contained in the front-surface side aluminum layer 3 is intended to suppress a phenomenon called 'alloy spikes' where the front-surface side aluminum layer 3 enters into the silicon layer 2 under the front-surface side aluminum layer 3. The silicon included in the front-surface side aluminum layer 3 is segregated as nodules (small masses of silicon) when the front-surface side aluminum layer 3 is heated.

The insulation film 5 is disposed between the silicon layer 2 and the front-surface side aluminum layer 3. The insulation film 5 is disposed on the silicon layer, 2 and the front-surface side aluminum layer 3 is disposed on the insulation film 5. The insulation film 5 covers the front surface of the silicon layer 2. The insulation film 5 contacts a part of the front surface of the silicon layer 2. The insulation film 5 is for example made of silicon dioxide (SiO2) and can be formed by thermally oxidizing the front surface of the silicon layer 2. The insulation film 5 is formed so as to have a substantially uniform thickness.

Figure 2:
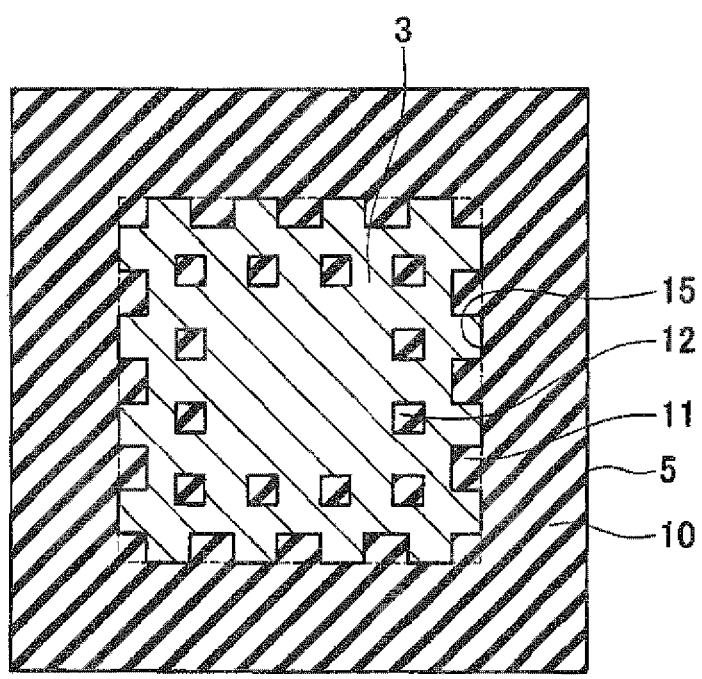
FIG. 2 is a sectional view taken II-II of FIG. 1.

A structure of the insulation film 5 in a plan view is described. FIG. 2 is a view seen along a vertical direction relative to the front surface of the silicon layer 2. As shown in FIG. 2, the insulation film 5 is adjacent to and contacts the front-surface side aluminum layer 3. The insulation film 5 includes an insulation film body 10 contacting the front-surface side aluminum layer 3 and a plurality of first nodule segregated portions 11 projecting from the insulation film body 10 toward the front-surface side aluminum layer 3. The insulation film 5 further includes a plurality of second nodule segregated portions 12 disposed apart from the insulation film body 10. The first nodule segregated portions 11 and the second nodule segregated portions 12 are positioned apart from each other.

Figure 3:
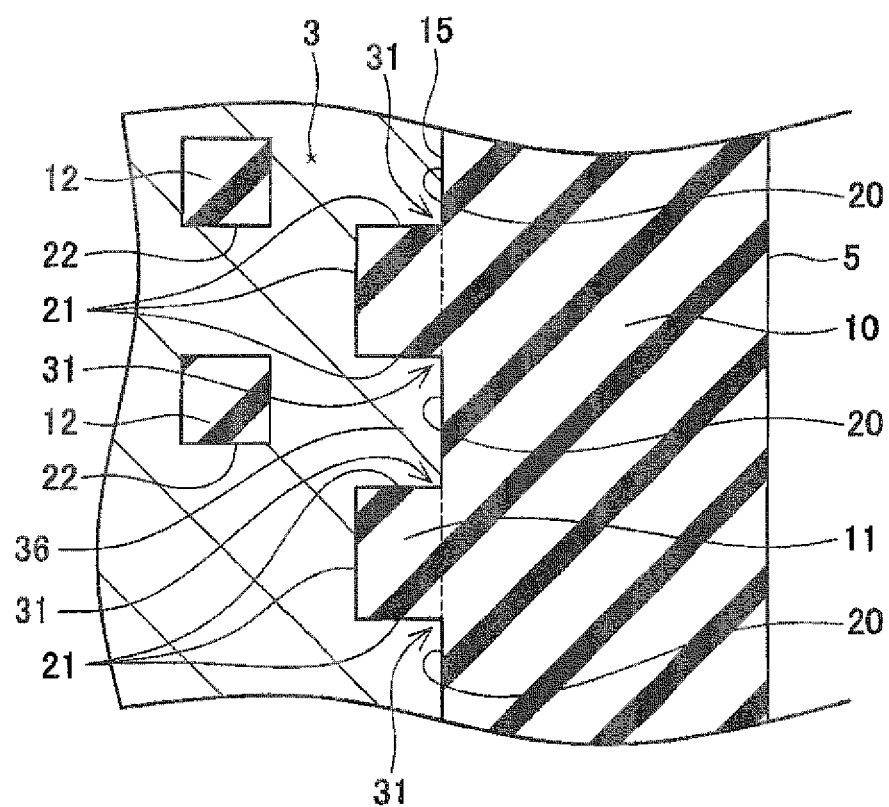
FIG. 3 is an enlarged view of a principal part of the semiconductor device according to the embodiment.

The insulation film body 10 is disposed in a rectangular ring shape. As shown in FIG. 3, the insulation film body 10 has a side surface 20. The side surface 20 of the insulation film body 10 faces and contacts the front-surface side aluminum layer 3. A contact hole 15 is formed by a part surrounded by the insulation film body 10. The contact region 42 of the silicon layer 2 is exposed through the contact hole 15, and the front-surface side aluminum layer 3 contacts the exposed contact region 42.

The plurality of first nodule segregated portions 11 is arranged in alignment with a space between one another and interspersed on the silicon layer 2. Each of the first nodule segregated portions 11 is formed into a rectangular shape. Each of the first nodule segregated portions 11 has side surfaces 21. The side surfaces 21 include two side surfaces 21 extending in a direction perpendicular to the side surface 20 of the insulation film body 10 and one side surface 21 extending in a direction parallel to the side surface 20 of the insulation film body 10. The side surfaces 21 of the first nodule segregated portions 11 face and contact the front-surface side aluminum layer 3. Each of the two side surfaces 21 extending perpendicular to the side surface 20 of the first nodule segregated portion 11 meets the side surface 20 of the insulation film body 10. A first corner 31 is formed in a part where the side surface 20 of the insulation film body 10 and each of the two side surfaces 21 of each first nodule segregated portion 11 meet each other. The first corners 31 are formed in parts where the insulation film body 10 and the first nodule segregated portions 11 contact each other. Each first corner 31 contacts the front-surface side aluminum layer 3. More specifically, one first corner 31 is formed between the side surface 20 and each of the side surfaces 21 extending perpendicular to the side surface 20.

An angle of each of the first corners 31 is not limited to 90 degrees (right angle). The angle of the first corners 31 is set to be less than 180 degrees, and more preferably less than 90 degrees. A silicon nodules are likely to be segregated intensively at the first corners 31 when the front-surface side aluminum layer 3 is heated. A recess 36 is formed in a part surrounded by the side surfaces 21 of the adjacent first nodule segregated portions 11 and the side surface 20 of the insulation film body 10. Each recess 36 is filled with the front-surface side aluminum layer 3.

The plurality of second nodule segregated portions 12 is arranged in alignment with a space between one another, and linearly interspersed on the silicon layer 2. The second nodule segregated portions 12 are disposed on an inner side than the ring-shaped insulation film body 10 (inside the contact hole 15). The second nodule segregated portions 12 are disposed closer to a central part of the contact hole 15 than the first nodule segregated portions 11, and further the second nodule segregated portions 12 are positioned so as not to overlap the central part of the contact hole 15. It is preferable that the second nodule segregated portions 12 be positioned apart from the central part of the contact hole 15 such that nodules are not segregated at the central part of the contact hole 15 (central part of the contact region 42). Meanwhile, it is also preferable that the second nodule segregated portions 12 be positioned not to be too far away from the central part of the contact hole 15 in order for the nodules of silicon contained in the front-surface side aluminum layer 3 at the central part of the contact hole 15 to be segregated at the second nodule segregated portions 12. It is therefore preferable that each of the second nodule segregated portions 12 and the central part of the contact hole 15 be disposed apart from each other by a distance preferably ranging within 3 to 10 μm. Each of the second nodule segregated portions 12 is formed into a rectangular shape. Each of the second nodule segregated portions 12 has side surfaces 22. The side surfaces 22 of each second nodule segregated portion 12 face and contact the front-surface side aluminum layer 3.

An exemplary method of manufacturing a semiconductor device is described next. For manufacture of the aforementioned semiconductor device 1, the insulation film 5 is firstly layered on the front surface of the silicon layer 2. More specifically, the front surface of the silicon layer 2 is thermally oxidized to form an oxidized film. Next, an unnecessary part of the resultant oxidized film is removed by etching. More specifically, the unnecessary part of the oxidized film is removed so as to leave the insulation film body 10, the first nodule segregated portions 11, and the second nodule segregated portions 12 of the insulation film 5 unremoved and to form the contact hole 15. As a result, the insulation film 5 is formed on the silicon layer 2.

Next, the front-surface side aluminum layer 3 is layered on the front surface of the silicon layer 2. The front-surface side aluminum layer 3 can be formed by sputtering. The front-surface side aluminum layer 3 is also formed on the surface of the insulation film 5. Then, an unnecessary part of the resultant front-surface side aluminum layer 3 is removed by etching. As a result, the front-surface side aluminum layer 3 is formed on the silicon layer 2 and the insulation film 5. The insulation film 5 is disposed between the silicon layer 2 and the front-surface side aluminum layer 3.

Next, the silicon layer 2, the insulation film 5, and the front-surface side aluminum layer 3 are heated entirely while they are layered on one another. The heating is conducted at a temperature from about 400° C. to about 600° C. The heating forms an alloy at a part where the silicon layer 2 and the front-surface side aluminum layer 3 are bonded, thereby bonding the silicon layer 2 and the front-surface side aluminum layer 3. As a result, an aluminum electrode is formed on the silicon layer 2.

In the aforementioned semiconductor device 1, silicon contained in the front-surface side aluminum layer 3 is segregated as nodules (small masses of silicon) when the front-surface side aluminum layer 3 is heated. The silicon nodules are segregated so as to be attached to the side surface 20 of the insulation film body 10, the side surfaces 21 of the first nodule segregated portions 11, and the side surfaces 22 of the second nodule segregated portions 12, for example. At this time, as a result of the presence of the first corners 31 formed by the side surface 20 of the insulation film body 10 and the side surfaces 21 of the first nodule segregated portions 11 in the aforementioned semiconductor device 1, the silicon nodules are segregated intensively at the first corners 31. In this way, the silicon nodules can be concentrated at the first corners 31 such that the silicon nodules can be distributed locally by forming the first corners 31 in the insulation film 5 in the aforementioned semiconductor device 1. Thus, forming of the first corners 31 allows positional control as to where the nodules are to be segregated. Allowing such a positional control makes it easy to reduce resistance and suppress operation of a parasitic element in the contact region 42, for example. Further, nodules can be collected by a simple structure that can be achieved simply by having the side surface 20 of the insulation film body 10 and the side surfaces 21 of the first nodule segregated portions 11 form the first corners 31 using the insulation film 5.

Figure 4:
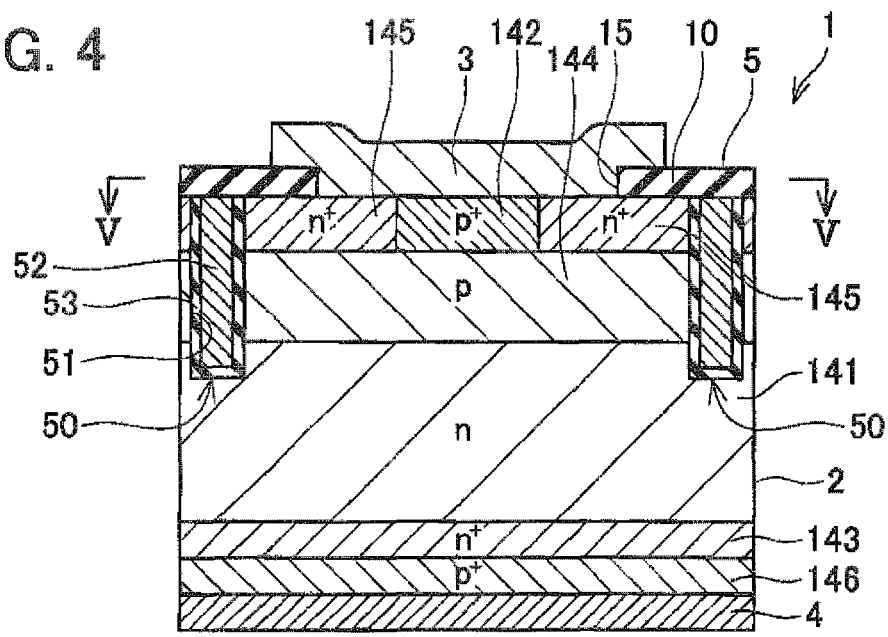
FIG. 4 is a sectional view of a semiconductor device according to another embodiment.

Although one embodiment has been described as above, a specific mode of embodying the present invention is not limited to the embodiment described above. An IGBT (Insulated Gate Bipolar Transistor) is applicable as a different example of the semiconductor device. As shown in FIG. 4, a silicon layer 2 in a semiconductor device (IGBT) 1 of another embodiment includes a p-type collector region 146, an n-type buffer region 143 layered on the collector region 146, an n-type drift region 141 layered on the buffer region 143, a p-type body region 144 layered on the drift region 141, an n-type emitter region 145 layered on the body region 144, and a p-type contact region 142 layered on the body region 144. The emitter and contact regions 145 and 142 of the silicon layer 2 are exposed through a contact hole 15 formed in an insulation film 5. A front-surface side aluminum layer 3 contacts the emitter and contact regions 145 and 142 exposed through the contact hole 15. A rear-surface side aluminum layer 4 to become an electrode is layered on a rear surface of the collector region 146.

Further, the semiconductor device 1 of FIG. 4 includes a trench gate 50 extending inward from the front surface of the silicon layer 2. The trench gate 50 includes a trench 51 extending inward from the front surface of the silicon layer 2, a gate electrode 52 disposed inside the trench 51, and a gate insulation film 53 covering the gate electrode 52. The insulation film 5 is disposed on a surface of the trench gate 50 to cover the trench gate 50.

Figure 5:
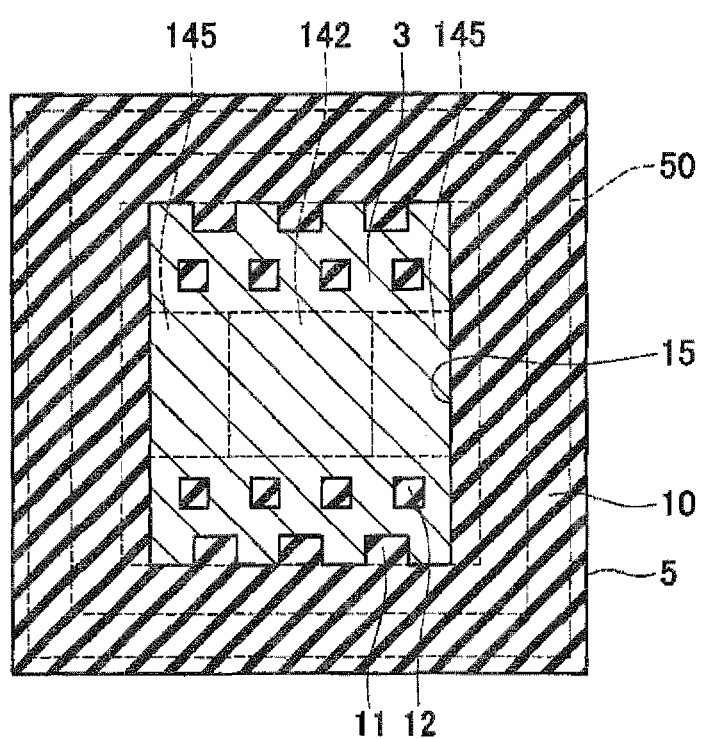
FIG. 5 is a sectional view taken V-V of FIG. 4.

A structure of the insulation film 5 in a plan view is described. FIG. 5 is a view as seen along the vertical direction relative to the front surface of the silicon layer 2. As shown in FIG. 5, an insulation film body 10 of the insulation film 5 is disposed in a rectangular ring shape. Likewise, the trench gate 50 is disposed in a rectangular ring shape. A layout of the insulation film body 10 matches a layout of the trench gate 50, and the insulation film body 10 covers the trench gate 50. Second nodule segregated portions 12 of the insulation film 5 are disposed at positions not overlapping the emitter and contact regions 145 and 142. It should be noted that elements of FIGS. 4 and 5 comparable to those of FIGS. 1 and 2 are identified by the same reference numerals and descriptions thereof will be omitted.

Figure 6:
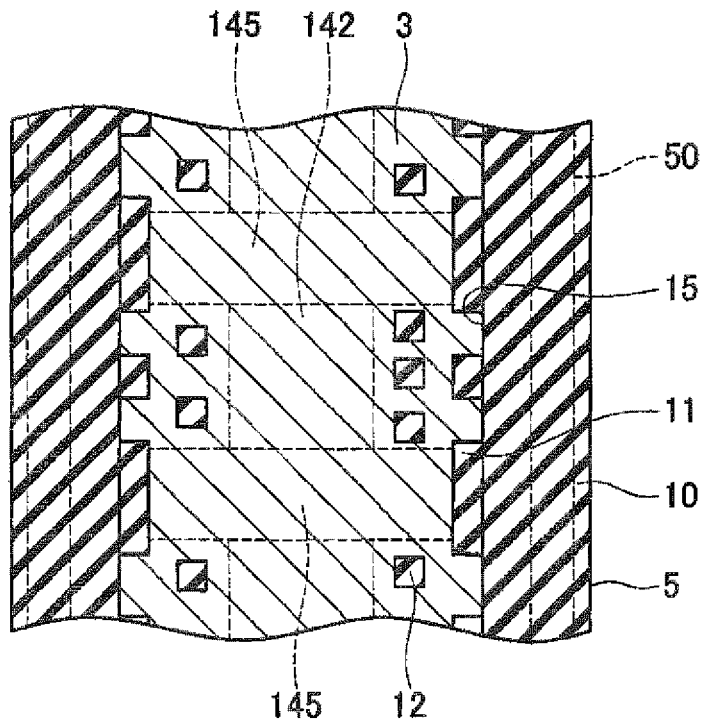
FIG. 6 is a sectional view corresponding to FIG. 5 according to a still another embodiment.

The trench gate 50 according to the embodiment of FIG. 4 is disposed in a ring shape, however, this is not the only shape of the trench gate 50. As shown in FIG. 6, a plurality of trench gates 50 may be disposed in a stripe pattern. Each trench gate 50 extends as a straight line as seen along the vertical direction relative to the front surface of the silicon layer 2. The plurality of trench gates 50 is arranged in alignment so as to extend in the same direction. It should be mentioned herein that elements of FIG. 6 comparable to those of FIG. 5 are identified by the same reference numerals and descriptions thereof will be omitted.

The IGBT is shown as an example of the semiconductor device in the description above. However, this is not the only structure of the semiconductor device but the structure can be changed appropriately. As an example, an MOSFET (Metal Oxide Semiconductor Field Effect Transistor) or a Schottky barrier diode (SBD) is applicable as the semiconductor device.

Figure 7:
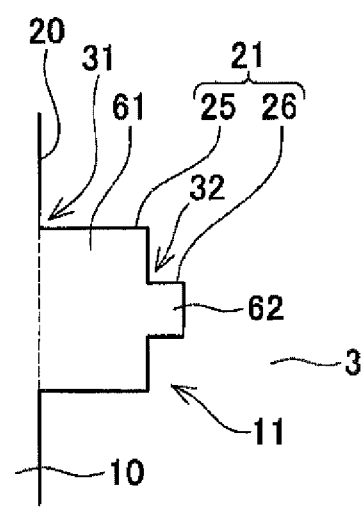
FIG. 7 is an enlarged view of a principal part of a semiconductor device according to a still another embodiment.

Each of the first nodule segregated portions 11 according to the aforementioned embodiment has a rectangular shape, however, this is not the only shape of the first nodule segregated portions 11. According to another embodiment, a first nodule segregated portion 11 may include a first convex portion 61 projecting from an insulation film body 10 toward a front-surface side aluminum layer 3 and a second convex portion 62 projecting from the first convex portion 61 as shown in FIG. 7. The first and second convex portions 61 and 62 are formed integrally. The first and second convex portions 61 and 62 are each formed into a rectangular shape. The first convex portion 61 has side surfaces 25. The second convex portion 62 has side surfaces 26. The side surfaces 25 and 26 of the first and second convex portions 61 and 62 include side surfaces extend in the direction perpendicular to the side surface 20 of the insulation film body 10 and side surfaces extending in the direction parallel to the side surface 20 of the insulation film body 10. The respective side surfaces 25 and 26 of the first and second convex portions 61 and 62 each form a part of the side surface 21 of the corresponding first nodule segregated portion 11. For example, each side surface 21 of a first nodule segregated portion 11 includes the side surfaces 25 and 26.

The side surfaces 25 and 26 face and contact the front-surface side aluminum layer 3. The side surfaces 25 of each first convex portion 61 extending perpendicular to the side surface 20 meet the side surface 20 of the insulation film body 10. A first corner 31 is formed in a part where the side surface 20 of the insulation film body 10 and each of the aforementioned side surfaces 25 of the first convex portion 61 meet each other. The side surfaces 26 of the second convex portion 62 extending perpendicular to the side surface 20 meet their corresponding side surface 25 of the first convex portion 61. A second corner 32 is formed at a part where the side surface 25 of the first convex portion 61 and the side surface 26 of the second convex portion 62 meet each other. The second corners 32 are formed at parts where the first and second convex portions 61 and 62 contact each other. The second corners 32 contact the front-surface side aluminum layer 3. An angle of the second corners 32 is not limited to 90 degrees (right angle). The angle of the second corners 32 is set to be less than 180 degrees, and more preferably less than 90 degrees. Silicon nodules are likely to be segregated intensively at the second corners 32 when the front-surface side aluminum layer 3 is heated.

Figure 8:
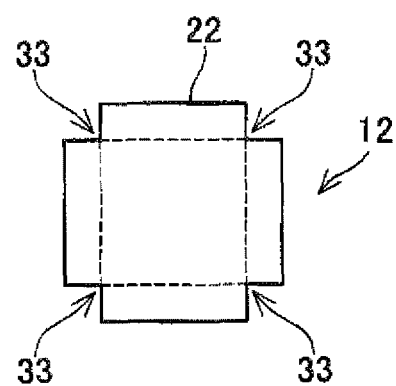
FIG. 8 is a plan view showing a second nodule segregated portion.
Figure 9:
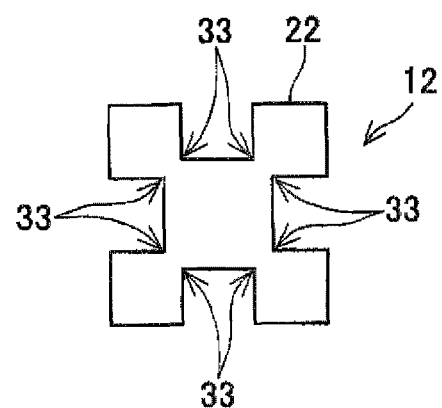
FIG. 9 is a plan view showing a second nodule segregated portion.

Each of the second nodule segregated portions 12 according to the aforementioned embodiment has a rectangular shape, however, this is not the only shape of the second nodule segregated portions 12. The second nodule segregated portions 12 can be formed into various shapes such as those shown in FIGS. 8 and 9, for example. According to each of embodiments shown in FIGS. 8 and 9, a second nodule segregated portion 12 has a plurality of third corners 33 as seen along the vertical direction relative to the front surface of the silicon layer 2. Each side surface 22 of the second nodule segregated portion 12 is bent to form the plurality of third corners 33. An angle of the third corners 33 is set to be less than 180 degrees, and more preferably less than 90 degrees. In this structure, silicon nodules are likely to be segregated intensively at the third corners 33.

The aforementioned embodiment including the second nodule segregated portions 12 is not the only structure. In an alternative embodiment, the second nodule segregated portions 12 can be omitted.

The structure of the first nodule segregated portions 11 and that of the second nodule segregated portions 12 are not limited to those of the aforementioned embodiment. As an example, one or more concave portions (not shown in the drawings) may be formed in a surface of each of the first nodule segregated portions 11 and in a surface of each of the second nodule segregated portions 12. According to this structure, the silicon nodules can be segregated in the one or concave portions formed in the surfaces.

In the aforementioned embodiment, the silicon layer 2 is used as an example of the semiconductor layer, however, this is not limited to this structure. As an example, a layer of silicon carbide (SiC) is applicable as the semiconductor layer.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

Some of other features of the present disclosure will be listed below. It should be noted that each of the features listed below is independently useful.

1. In the above semiconductor device, each of the first nodule segregated portions may include a first convex portion projecting from the insulation film body and a second convex portion projecting from the first convex portion.

2. The insulation film body may be disposed in a ring shape as seen along the vertical direction.

3. The semiconductor device may further comprise a trench gate extending inward from the surface of the semiconductor layer. A layout of the insulation film body and a layout of the trench gate may match as seen along the vertical direction.

4. The insulation film may further include one or more second nodule segregated portions disposed apart from the insulation film body as seen along the vertical direction.

5. A corner may be formed on the one or more second nodule segregated portions as seen along the vertical direction.

What is claimed is:

1. A semiconductor device comprising:
   a semiconductor layer;
   an aluminum layer containing silicon, the aluminum layer contacting and layered on a part of a surface of the semiconductor layer; and
   an insulation film contacting and layered on another part of the surface of the semiconductor layer, the insulation film being adjacent to and contacting the aluminum layer;
   wherein the insulation film is formed in a pattern to include an insulation film body and a plurality of first nodule segregated portions projecting from the insulation film body toward the aluminum layer as seen along a vertical direction relative to the surface of the semiconductor layer, and
   a corner is formed by a side surface of the insulation film body and a side surface of each of the first nodule segregated portions as seen along the vertical direction.

2. The semiconductor device according to claim 1, wherein
   each of the first nodule segregated portions includes a first convex portion projecting from the insulation film body and a second convex portion projecting from the first convex portion.

3. The semiconductor device according to claim 1, wherein
   the insulation film body is disposed in a ring shape as seen along the vertical direction.

4. The semiconductor device according to claim 1, further comprising
   a trench gate extending inward from the surface of the semiconductor layer, wherein
   a layout of the insulation film body and a layout of the trench gate match as seen along the vertical direction.

5. The semiconductor device according to claim 1, wherein
   the insulation film further includes one or more second nodule segregated portions disposed apart from the insulation film body as seen along the vertical direction.

6. The semiconductor device according to claim 5, wherein
   a corner is formed on the one or more second nodule segregated portion as seen along the vertical direction.

\* \* \* \* \*